United States Patent
Trabucco

[19]

[11] Patent Number: 5,899,737
[45] Date of Patent: May 4, 1999

[54] FLUXLESS SOLDER BALL ATTACHMENT PROCESS

[75] Inventor: Robert T. Trabucco, Loa Antos, Calif.

[73] Assignee: LSI Logic Corporation, Milpitas, Calif.

[21] Appl. No.: 08/717,601

[22] Filed: Sep. 20, 1996

[51] Int. Cl.$^6$ .......................... H01L 23/488; H01L 21/44
[52] U.S. Cl. .......................... 438/615; 438/661; 438/662; 257/738; 29/843
[58] Field of Search .................................. 438/612, 613, 438/615, 661, 662, 965, FOR 343, FOR 348, FOR 364; 257/737, 738; 29/840, 843

[56] References Cited

U.S. PATENT DOCUMENTS

| | | | |
|---|---|---|---|
| 4,542,439 | 9/1985 | Dick ........................................ | 361/405 |
| 4,921,157 | 5/1990 | Dishon et al. ........................... | 228/124 |
| 5,000,819 | 3/1991 | Pedder et al. ............................ | 156/643 |
| 5,442,852 | 8/1995 | Danner ..................................... | 29/843 |
| 5,451,274 | 9/1995 | Gupta ...................................... | 438/661 |
| 5,492,265 | 2/1996 | Wandke .................................... | 228/205 |
| 5,495,089 | 2/1996 | Freedman et al. ........................ | 29/840 |
| 5,597,469 | 1/1997 | Carey et al. .............................. | 205/118 |
| 5,609,290 | 3/1997 | Bobbio et al. ........................... | 228/206 |
| 5,663,594 | 9/1997 | Kimura ................................... | 257/738 |

FOREIGN PATENT DOCUMENTS

| | | |
|---|---|---|
| 517430-A1 | 12/1992 | European Pat. Off. . |
| 59-218754 | 12/1984 | Japan . |
| 1-243554 | 9/1989 | Japan . |
| 3-138941 | 6/1991 | Japan . |
| 4-107892 | 4/1992 | Japan . |
| 6-061640 | 3/1994 | Japan . |

*Primary Examiner*—John F. Niebling
*Assistant Examiner*—Ha Tran Nguyen

[57] ABSTRACT

A fluxless method for fusing preformed solder balls to contact pads on a semiconductor package substrate wherein a masking plate having one or more vertical holes corresponding to the contact pads is placed over the package substrate, oxide-free solder balls are placed in the holes, the assembly is preheated to a temperature less than the melting point of the solder, and an energetic beam is directed onto the preformed solder balls to melt them and fuse them to the contact pads.

14 Claims, 1 Drawing Sheet

FLUXLESS SOLDER BALL ATTACHMENT PROCESS

BACKGROUND OF THE INVENTION

This invention relates to IC manufacture and assembly, and more particularly, to a method for mounting solder balls on a semiconductor substrate package.

Many different constructions and package lead counts are used by the semiconductor industry to protect and connect IC devices. One of the most current package formats is called a Ball Grid Array (BGA). This package consists of a ceramic or laminated PC board substrate onto which have been printed, plated or deposited a pattern of electrically conductive traces. A semiconductor die is mounted on one side of the substrate and electrically connected to these conductive traces. The conductive traces then branch out into an array pattern on the substrate surface. The array pattern can be on the same side of the substrate where the semiconductor die is mounted, or on the opposite side. Solder balls, which can be any one of a number of low temperature, conductive alloys, are then reflow soldered to the end of the conductive traces or "pads" in the array pattern. The solder balls provide the means for electrically connecting the conductive traces to the system in which it functions.

Several methods are currently used to mount the solder balls onto the BGA package substrate. In one such method, soldering flux is applied to the package pads, after which a fixturing device or pickup and placement head is used to place the preformed solder balls, individually or en mass, onto the pads. The package is then heated to the melting point of the solder alloy, which then wets and bonds to the package pads.

An alternate method uses a printing or dispensing fixture or process to apply measured quantities of solder paste, a mixture of fine solder particles in a paste flux vehicle, onto the package contact pads. The paste can be melted by itself to form the ball contacts, or, by placing preformed solder balls into the solder paste, used to attach the preformed solder balls to the package pads.

These soldering methods, and others, require a "flux" to remove contamination and oxides from the surfaces of the package pads and the solder balls or paste particles, to achieve a satisfactory wetting of the surface by the molten solder. However, this flux remains on the package after the solder is melted, necessitating a subsequent cleaning step. This additional step adds cost and manufacturing time to the construction of this type of semiconductor package. Currently, there are "no clean" fluxes available which become inert after soldering, but even those leave an undesirable residue on the surface.

An inert gas atmosphere such as nitrogen ($N_2$) could be used to surround the soldering process if the package substrate pads and the solder ball preforms were perfectly clean and oxide free. This would eliminate the need for flux and the resultant flux residue problem, but nitrogen will not remove contaminants, just inhibit them from forming at elevated temperatures. The flux, which is tacky, performs another very useful function, namely holding the solder ball preforms in position on the substrate pads prior to the soldering operation.

The present invention addresses an improved method of installing and soldering the solder balls onto the package substrate which eliminates the need for soldering flux and the attendant disadvantages.

SUMMARY OF THE INVENTION

The invention provides a method of positioning and fusing preformed solder ball onto the contact pads of a BGA semiconductor package substrate without using soldering flux. In one embodiment of the invention, the semiconductor package substrate is placed into or on a holding fixture which is supported on a transport belt, walking beam, or indexing table. The package substrate is moved to a first station where a masking plate of an inert and unsolderable material such as ceramic, tungsten or graphite is placed atop the package substrate. The masking plate includes a plurality of holes corresponding to the contact pattern on the underlying package substrate.

The assembly is then moved to a second station where a preformed solder ball is placed into each hole of the masking plate. The solder balls have preferably been pretreated by a process to remove all surface oxides. In one embodiment, the solder balls are pretreated by being exposed to an RF generated plasma containing fluorine compounds. The assembled substrate and masking plate, including the preformed solder balls, are then preheated to about 150° C. in an inert gas, and allowed to thermally stabilize.

The preformed solder balls are then melted to fuse them to the contact pads by scanning a beam of high energy Xenon light across the masking plate hole pattern. The beam causes the preheated solder balls to melt and fuse to the metalized contact pads of the package substrate. The whole fixture assembly is then cooled. The process is accomplished without using any soldering flux as is required in the prior art. Eliminating soldering flux from the process provides economy in the manufacturing process by eliminating a flux cleaning step, which also generates an additional waste product which must also be further processed for disposal.

The invention will now be described in greater detail by reference to the drawing.

DETAILED DESCRIPTION

Figure 1:
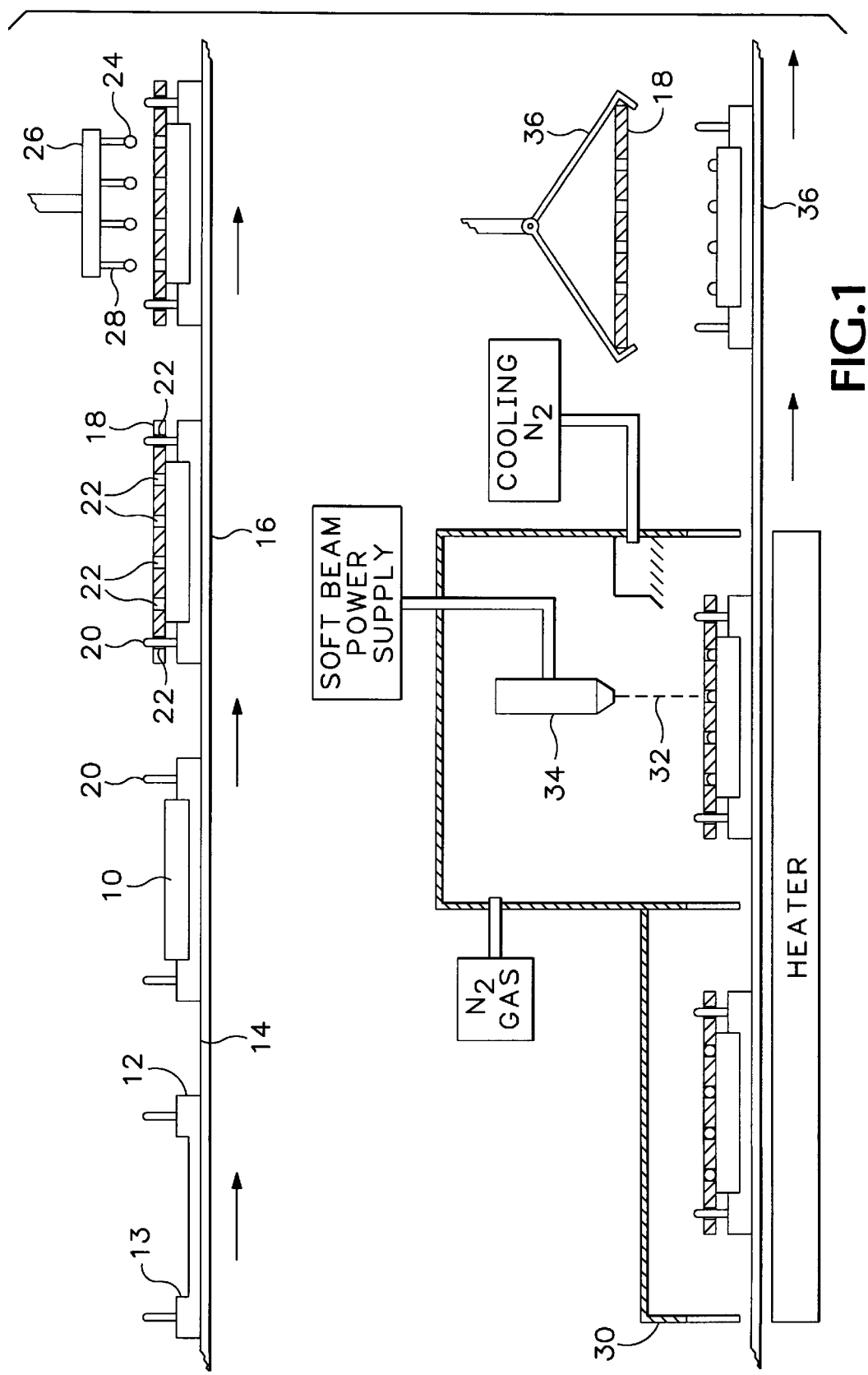
FIG. 1 is a schematic diagram of the method of the present invention.

Turning now to FIG. 1, the invention is embodied in a method wherein a BGA package substrate 10 is placed into a holding fixture 12 made of a suitable inert material. In the embodiment shown, the package substrate is received in a precisely shaped and positioned recess 13 in the holding fixture 12. Other means of locating and retaining the package substrate 10, such as locating pins for example, could also be employed. The holding fixture 12 is supported on a driven transport belt 14. Alternatively, the transport mechanism supporting the holding fixture 12 could be a walking beam or an indexing table without deviating from scope of the invention. After being placed into the holding fixture 12, the package substrate 10 is moved to a first station 16 where a masking plate 18 is placed onto the package substrate and package holding fixture. The masking plate 18 is precisely located atop the package substrate 10 by indexing pins 20 which are received in corresponding indexing holes 22 in the masking plate. Masking plate 18 is preferably made of an inert and unsolderable material, such as ceramic, tungsten or graphite for example, although the invention is not limited thereto. Masking plate 18 includes a plurality of holes 23 in a pattern corresponding to the desired contact pattern on the package substrate 10.

The package substrate 10 is then moved to a second station where a preformed solder ball 24 is placed into each of holes 23 in masking plate 18. Any of several known methods of sorting and placing the preformed solder balls can be used. In one known method, the solder balls are retrieved from a reservoir (not shown) using a vacuum pickup head 26, and are then released into the holes 23 of the masking plate 18. In one such embodiment, vacuum pickup head 26 includes multiple individual vacuum fixtures 28 arranged in a pattern which corresponds to the desired contact pattern on the package substrate 10. Alternatively, a hopper-shaped reservoir (not shown) of preformed solder balls can be moved over a pattern plate (not shown), and the preformed solder balls are dropped into holes 23 in the masking plate. Other methods are available and could be also used.

The preformed solder balls 24 are preferably pretreated to remove essentially all oxides from the surface of the preformed solder balls. Oxides inhibit the wetting of the surface by the solder, and are therefore an undesirable contaminant when present. One method of pretreating the solder balls to remove oxides is by a plasma conversion process known as "PADS", which is an acronym for "Plasma-Assisted Dry Soldering", which was developed by Integrated Electronic Innovations, Inc. In the PADS process, the preformed solder balls are exposed to an RF generated plasma generated from a gas such as $CF_4$ or $SF_6$, which converts any oxides on the surface of the solder balls into fluorine compounds. Unlike oxides, the fluorine compounds do not inhibit the wetting of the contact pad by the melted solder.

After insertion of the preformed solder balls, the assembly is ready for the final processing steps. The assembly, which now includes the package substrate 10, the masking plate 18, and the oxide-free, preformed solder balls, is moved into a low-temperature oven 30. Inside oven 30, the assembly is shrouded in an essentially oxygen-free gas, and preheated. The shrouding gas is preferably nitrogen, owing to its low toxicity, ready availability and low-cost. In the preferred embodiment, the assembly is preheated to about 150° C., and then allowed to thermally stabilize for several minutes. The precise preheat temperature is not critical, so long as it is lower than the melting temperature of the solder.

Once stabilized at the preheat temperature, the preformed solder balls 24 are further heated to melt and fuse them to their underlying contact pads on the package substrate 10. In prior art processes, the preformed solder balls are melted and fused to the contact pads by heating the package substrate, the masking plate, and the preformed solder balls in a conveyor furnace to at least the melting point of the preformed solder balls.

In the present invention, and contrary to known processes, the preformed solder balls are melted and fused to the contact pads by exposing the preformed solder balls to an energetic beam 32 for a predetermined time, which provides the additional energy required to melt the preformed solder balls and fuse them to the contact pads. The primary advantage of this method is that a portion of the energy required to melt the preformed solder balls is provided quickly and selectively without heating the entire assembly.

In the preferred embodiment of the invention, the final heating and melting of the solder balls is accomplished by scanning a beam of high-energy Xenon light 32 over the hole pattern in masking plate 18. Equipment used to supply the high-energy Xenon light beam is a "soft beam" fiber optic light system manufactured by Panasonic Factory Automation Company, a Division of Matsushita Electric Corporation of America. In that system, the light beam 32 is generated by a Xenon light source within housing 34. An assembly of lens elements (not shown) focus the light beam into the end of a fiber optical light guide (not shown), the opposite end of which is attached to a converging lens assembly (not shown), which focuses the light beam into either a single high intensity spot or a line of energy. This line or spot is scanned across the hole pattern in the masking plate 18, causing the preformed solder balls 24 to melt and fuse to the contact pads of the package substrate. As an alternative, a laser beam could be used, but suffers the disadvantage of being much more difficult to control, and being more likely to thermally shock the contact pad. After the preformed solder balls have been melted and fused to the contact pads of the package substrate 10, the assembly is cooled, preferably by a stream of lower temperature nitrogen. After cooling, the assembly is moved to the final station 36 where the masking plate 18 is removed from the holding fixture by any suitable grasping apparatus 38. Owing to the absence of soldering flux, the package substrate 10 may be further processed without the need for a flux removal and cleaning step required in prior art methods.

The method of this invention offers a number of advantages. All of the process steps can be accomplished under relatively simple mechanical control. The masking plate restricts the flow of molten solder and minimizes the likelihood of shorting between adjacent contact pads. The contamination and oxides are removed from the preformed solder balls prior to their insertion into the masking plate. Since no flux is needed, there is no need for a cleaning process to remove flux residue from the vicinity of the contact pads. The entire process takes less time than current soldering processes using conveyor furnaces. It also completely eliminates the requirement of cleaning the package substrate after attachment of the preformed solder balls. Finally, the faster heating and cooling of the preformed solder balls results in a much finer solder grain structure, and a stronger bonding of the solder to the contact pad.

Those skilled in the art will appreciate that the foregoing examples are illustrative only, and that the invention can be practiced with variations to the foregoing examples without departing from the scope of the following claims.

I claim:

1. A method of attaching solder balls to a substrate comprising the steps of:

providing a semiconductor package substrate having at least one contact point;

providing a movable holding fixture which is operable to transport the package substrate to a plurality of processing locations;

placing the package substrate on the holding fixture;

moving the holding fixture and substrate package to a first processing location;

covering at least a portion of the package substrate with a masking plate, the masking plate including surfaces defining a plurality of holes corresponding to the at least one contact point on the package substrate;

moving the holding fixture, substrate package and masking plate to a second processing location;

placing solder balls into the plurality of holes in the masking plate, the solder balls having surfaces which are essentially oxide-free;

moving the substrate package to a third processing location; preheating the substrate package, masking plate and solder to a temperature not greater than the melting point of the solder balls;

moving the substrate package to a fourth processing location; and fusing the solder to said at least one contact point by exposing the solder to an energetic beam comprising a focused, high-energy Xenon light beam.

2. The method of claim 1 which further includes the step of producing substantially oxide-free solder balls.

3. The method of claim 2 wherein the step of producing substantially oxide-free solder balls comprises the steps of:
providing solder balls having an oxide-containing outer portion; and
converting the oxide-containing outer portion to a substantially oxide-free outer portion.

4. The method of claim 3 wherein the step of converting the oxide-containing outer portion to a substantially oxide-free outer portion includes the step of exposing the solder ball to a fluorine-containing compound.

5. The method of claim 4 wherein the fluorine-containing compound is selected from the group consisting of $CF_4$ and $SF_6$.

6. The method of claim 4 wherein the fluorine-containing compound comprises a plasma.

7. The method of claim 6 which comprises the step of exposing the oxide-containing outer portion to an RF-generated, fluorine-containing plasma.

8. The method of claim 1 wherein the substrate package, masking plate and solder are preheated to about 150° C.

9. The method of claim 1 wherein the masking plate and solder are preheated in a substantially oxygen-free environment.

10. The method of claim 9 wherein the substantially oxygen-free environment comprises a substantially oxygen-free gas.

11. The method of claim 10 wherein the substantially oxygen-free gas is selected from the group consisting of helium, neon, nitrogen, argon, krypton, xenon and radon.

12. The method of claim 1 wherein the step of melting at least a portion of the solder includes the step of scanning the energetic beam over the plurality of holes in the masking plate.

13. The method of claim 1 further comprising the step of cooling the substrate and the solder.

14. The method of claim 1 wherein the masking plate of an inert and unsolderable material selected from the group consisting of a ceramic, tungsten or graphite.

* * * * *